(12) United States Patent
Kajii

(10) Patent No.: US 7,617,962 B2
(45) Date of Patent: Nov. 17, 2009

(54) CONDUCTIVE BALL MOUNTING METHOD, AND APPARATUS THEREFOR

(75) Inventor: Yoshihisa Kajii, Kanazawa (JP)

(73) Assignee: Shibuya Kogyo Co., Ltd, Ishikawa (JP)

( * ) Notice: Subject to any disclaimer, the term of this patent is extended or adjusted under 35 U.S.C. 154(b) by 471 days.

(21) Appl. No.: 11/391,214

(22) Filed: Mar. 29, 2006

(65) Prior Publication Data

US 2006/0219755 A1    Oct. 5, 2006

(30) Foreign Application Priority Data

Mar. 31, 2005   (JP)   ............... P2005-101360
Aug. 31, 2005   (JP)   ............... P2005-251092

(51) Int. Cl.
  *B23K 15/00*   (2006.01)
(52) U.S. Cl. ............... 228/32; 228/25; 228/214; 228/223; 228/13; 228/19; 228/22; 228/12; 228/8; 118/56; 118/70; 118/204
(58) Field of Classification Search ............ 228/214, 228/223, 13, 19, 22, 33, 25, 32, 8, 12; 118/56, 118/70, 204
See application file for complete search history.

(56) References Cited

U.S. PATENT DOCUMENTS 5,750,199 A * 5/1998 Sakemi ............ 427/357

6,070,783 A * 6/2000 Nakazato ............ 228/105
6,315,185 B2 * 11/2001 Kajii ............ 228/8
6,575,351 B1 * 6/2003 Kobayashi et al. ............ 228/207
2001/0015372 A1 * 8/2001 Yamamoto et al. ............ 228/180.22
2003/0213832 A1   11/2003 Kang et al.

FOREIGN PATENT DOCUMENTS

JP    11330123 A   * 11/1999
JP    2001-007136 A   1/2001

OTHER PUBLICATIONS

Chinese Office Action dated Dec. 5, 2008.

* cited by examiner

*Primary Examiner*—Kiley Stoner
*Assistant Examiner*—Erin B Saad
(74) *Attorney, Agent, or Firm*—Sughrue Mion, PLLC

(57) ABSTRACT

A conductive ball mounting apparatus and method for holding a conductive ball on the holding face, as has a suction port formed therein, of a holder head thereby to mount the held conductive ball, while interposing a flux therein, on a workpiece. After the end of the mounting action and before a next conductive ball is held, flux removing means for removing the flux adhered to the holding face is brought into abutment against the holding face of the holder head thereby to remove the flux from holding face.

10 Claims, 4 Drawing Sheets

CONDUCTIVE BALL MOUNTING METHOD, AND APPARATUS THEREFOR

This application is based on Japanese Patent Applications No. 2005-101360 and 2005-251092, which are incorporated herein by reference.

BACKGROUND OF THE INVENTION

1. Field of the Invention

The present invention relates to improvements in a conductive ball mounting method and an apparatus therefor. The conductive ball mounting method and apparatus have been developed with a main view to removing the flux which is adhered to the holding face, as has a suction port formed therein, of a holder head.

2. Description of the Related Art

In case the conductive ball such as a solder ball is to be mounted in an electrode on a workpiece such as a substrate, there has been usually adopted a mounting method for adhering an adhesive flux to the solder ball or the electrode.

The space at the solder ball mounting time between the substrate and the holder head of the solder ball is so extremely short as is exemplified by one half to three quarters of the solder ball diameter, such as about 0.2 mm or shorter. Moreover, compressed air has to be injected so as to release the suction of the solder ball from the holder head after the solder ball mounting time. As a result, the flux may be blown away by the impact or wind pressure, by which the solder ball is pushed, and may be adhered around the suction port of the holder head. Still the worse, the dust adhered to the flux may be moved to bring the flux to the holding face of the holder head.

If the flux is thus adhered to the holding face of the holder head, a next solder ball may be held at a position other than the suction port when it is held by a solder ball feeding unit. Alternatively, the flux may be adhered to a solder ball in the solder ball feeding unit so that the solder balls may stick to each other.

In the flux transfer head, there has been provided a cleaning apparatus and a method therefor, as disclosed in JP-A-2001-7136. However, the related art has failed to provide a method for wiping off the flux adhered to the solder ball holding head, and an apparatus therefor.

SUMMARY OF THE INVENTION

The present invention contemplates to provide a conductive ball mounting method and an apparatus for removing a flux adhered to a holding face, by bringing flux removing means for removing the flux, after the end of a mounting action and before a next conductive ball is held on a holder head, into abutment against the holding face of the holder head thereby to prevent the excessive ball from sticking to the holder head and the balls in a ball feeding unit from sticking to each other.

In order to solve the aforementioned problems, according to a first aspect of the invention, there is provided a conductive ball mounting method comprising holding a conductive ball on a holding face of a holder head by sucking the conductive ball from a suction port formed in the holding face, and mounting the held conductive ball on a workpiece with interposing a flux therebetween, wherein, after the end of the mounting the held conductive ball and before a next holding the conductive ball, the method further comprises abutting flux removing means with the holding face, and removing the flux from the holding face by the flux removing means.

In a second aspect of the invention improved on the first aspect, there is provided a conductive ball mounting method further comprising injecting a compressed gas from the suction port either while the removing the flux from the holding face or after the removing the flux from the holding face and before the next holding the conductive ball.

In a third aspect of the invention improved on the first aspect, there is provided a conductive ball mounting method, further comprising inspecting the presence of the conductive ball left on the holding face before the removing the flux from the holding face.

In an apparatus for realizing the method of the first aspect of the invention, according to a fourth aspect of the invention, there is provided a conductive ball mounting apparatus comprising a holder head having a suction port formed in a holding face for sucking a conductive ball, a ball feeding unit for feeding the conductive ball to the holder head, a workpiece supporting unit for supporting a workpiece to mount the conductive ball thereon, and action means for positioning the holder head at the ball feeding unit and at the workpiece supporting unit, whereby the apparatus mounts the conductive ball on the workpiece with interposing a flux therebetween, wherein the apparatus further comprises flux removing means for removing the flux adhered to the holding face, and wherein the flux removing means is arranged in a relative action route at the time when the holder head is positioned at the ball feeding unit.

In a fifth aspect of the invention improved on the fourth aspect, there is provided a conductive ball mounting apparatus, wherein the apparatus further comprises residual ball inspecting means for inspecting the presence of the conductive ball on the holding face after the conductive ball is mounted on the workpiece, and wherein the flux removing means is arranged between the residual ball inspecting means and the ball feeding unit.

In a sixth aspect of the invention improved on the fourth or fifth aspect, there is provided a conductive ball mounting apparatus, wherein the flux removing means includes a cleaning member for wiping off the flux and moving means, and wherein the cleaning member can be moved by the moving means to an acting position where the cleaning member contacts with the holding face and to a saved position where the contact is avoided.

According to a seventh aspect of the invention, the following means is adopted in the conductive ball mounting apparatus.

At first, a conductive ball mounting apparatus comprises a holder head having a suction port formed in a holding face for sucking a conductive ball, a ball feeding unit for feeding the conductive ball to the holder head, a workpiece supporting unit for supporting a workpiece to mount the conductive ball thereon, and action means for positioning the holder head at a predetermined position, whereby the conductive ball is mounted on the workpiece with interposing a flux therebetween.

At second, the conductive ball mounting apparatus further comprises flux removing means for removing the flux adhered to the holding face.

At third, the flux removing means has an abutting face, against which the holding face of the holder head comes into abutment, so that the holding face and the abutting face may be moved relative to each other while contacting with each other.

In an eighth aspect of the invention improved on the seventh aspect, there is provided a conductive ball mounting apparatus, wherein the relative movements of the abutting face and the holding face are transverse reciprocations.

In a ninth aspect of the invention improved on the seventh or eighth aspect, there is provided a conductive ball mounting apparatus, further comprising an absorptive sheet for absorbing the flux on the abutting face thereby to wipe off the flux.

In a tenth aspect of the invention improved on the ninth aspect, there is provided a conductive ball mounting apparatus, further comprising shift preventing means disposed on the abutting face for preventing the absorptive sheet from coming out of position.

In an eleventh aspect of the invention improved on the any of seventh to tenth aspects, there is provided a conductive ball mounting apparatus, wherein the holding face is formed into a mirror surface or a water-repellent surface.

According to the first aspect of the invention, after the end of the mounting action and before a next conductive ball is held, flux removing means for removing the flux adhered to the holding face is brought into abutment against the holding face of the holder head thereby to remove the flux from holding face. At the time of holding the next conductive ball, therefore, it is possible to prevent the occurrence of an excess, to suppress the occurrence of the residual balls, and to prevent the balls from sticking to each other at the ball feeding unit.

According to the second aspect of the invention, the compressed gas is injected from the suction port of the holder head either while the flux is being removed from the holding face or after the flux was removed and before the next conductive ball is held. It is, therefore, possible to blow off the flux adhered to the edge of the suction port and to improve the reliability in the flux removal.

According to the third aspect of the invention, the presence of the conductive ball left on the holding face is inspected before the flux is removed from the holding face. Therefore, it is possible to reduce the danger that the flux removing means is pushed onto the residual ball thereby to push the residual ball into the suction port.

According to the fourth aspect of the invention, the flux removing means is comprised for removing the flux adhered to the holding face, and the flux removing means is arranged in the relative action route at the time when the holder head is positioned at the ball feeding unit. At the time of holding the next conductive ball, therefore, the apparatus can prevent the occurrence of an excess, can suppress the occurrence of the residual balls and can prevent the balls from sticking to each other at the ball feeding unit, so that the apparatus can realize the method according to the first aspect of the invention.

According to the fifth aspect of the invention, the residual ball inspecting means is comprised for inspecting the presence of the conductive ball on the holding face after the end of the mounting action, and wherein the flux removing means is arranged between the residual ball inspecting means and the ball feeding unit. Therefore, the residual ball can be discovered at or before the flux removing action thereby to reduce the danger that the residual ball is pushed into the suction port.

According to the sixth aspect of the invention, the flux removing means includes the cleaning member for wiping off the flux and moving means, and the cleaning member can be moved by the moving means to the acting position where the cleaning member contacts with the holding face and to the saved position where the contact is avoided. Therefore, the danger that the holder head collides with the flux removing means when the holder head moves near the flux removing means with a view other than that of removing the flux can be avoided to retain the safe run.

According to the seven aspect of the invention, the flux removing means is comprised for removing the flux adhered to the holding face, and has the abutting face, against which the holding face of the holder head comes into abutment, so that the holding face and the abutting face may be moved relative to each other while contacting with each other. Therefore, it is possible to reliably remove the flux adhered to the holding face, to prevent the occurrence of an excess ball, to prevent the occurrence of the residual balls, and to prevent the balls from sticking to each other at the ball feeding unit.

According to the eighth aspect of the invention, the relative movements of the abutting face and the holding face are transverse reciprocations. As a result, it is easy to control the flux removing means for removing the flux.

According to the ninth aspect of the invention, the absorptive sheet is comprised for absorbing the flux to the abutting face thereby to wipe off the flux. Therefore, the absorptive sheet can be sopped with the flux by the contact thereby to remove the flux adhered to the holder head, more reliably.

According to the tenth aspect of the invention, the shift preventing means is disposed on the abutting face for preventing the absorptive sheet from coming out of position. Therefore, the absorbent sheet can be firmly fixed at the time of the relative movements thereby to remove the flux more reliably.

According to the eleventh aspect of the invention, the holding face is formed into the mirror surface or the water-repellent surface. The flux can be removed easily and reliably.

DETAILED DESCRIPTION OF THE PREFERRED EMBODIMENTS

First Embodiment

Figure 1:
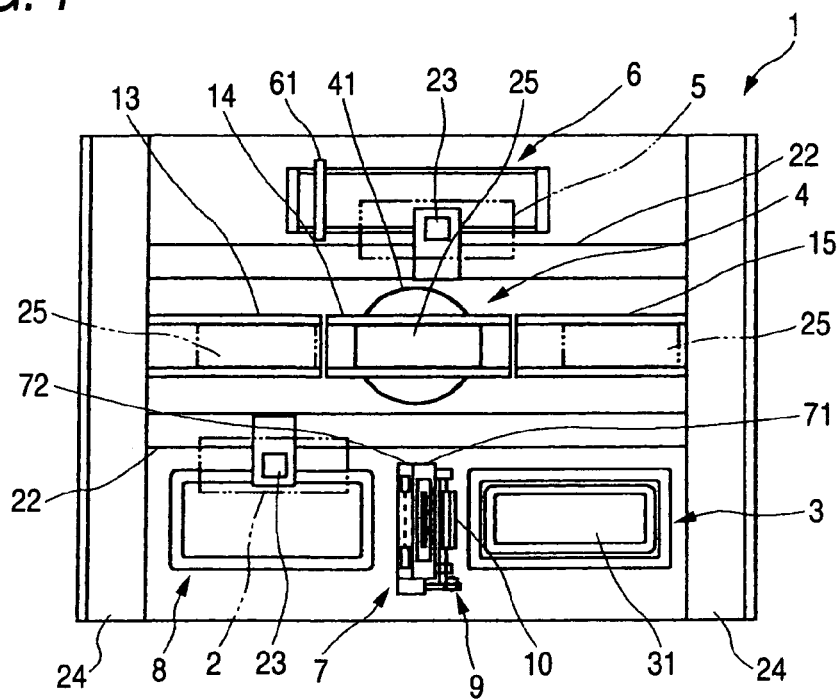
FIG. 1 is a schematically explanatory top plan view showing the entirety of a solder ball mounting apparatus according to a first embodiment.
Figure 2:
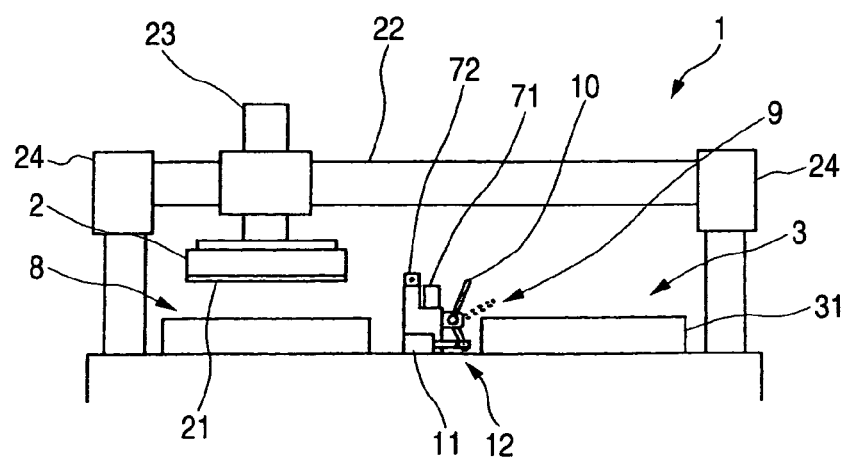
FIG. 2 is an explanatory front elevation of the same.

A first embodiment of the invention is described with reference to the accompanying drawings. The first embodiment uses a solder ball mounting apparatus as the conductive ball mounting apparatus. FIG. 1 is a schematically explanatory top plan view showing the entirety of a solder ball mounting apparatus 1, and FIG. 2 is a front elevation of the same.

The solder ball mounting apparatus 1 is constituted to include: a holder head 2 for sucking and holding a solder ball 30 by vacuum; a ball feeding unit 3 for reserving the solder balls 30 in multiplicity; a workpiece supporting unit 4 for supporting a substrate 25 or a workpiece to mount the solder ball 30; a transfer head 5 for transferring a flux to the substrate 25; a flux feeding unit 6 for feeding the flux to the transfer head 5; a ball inspection unit 7 acting as ball inspecting means for inspecting the ball held on a holding face 21 of the holder head 2; a solder ball recovery unit 8 for recovering the residual solder balls 30 left on the holder head 2; and a flux removing unit 9 for removing the flux adhered to the holding face 21 of the holder head 2.

In the holder head 2, the holding face 21 has a suction port 20 for attracting the solder ball 30 directly to a predetermined position in the lower face thereof so as to suck and hold the solder ball 30 and to mount the solder ball 30 on the substrate 25. To the holder head 2, on the other hand, there are connected vacuum means 26 for applying a vacuum to the internal space of the holder head 2 and pressure means 27 (gas supplying means) for applying a positive pressure to the internal space of the holder head 2. The vacuum means 26 sucks and holds the solder ball 30, and the pressure means 27 injects compressed air to release the suction after the solder ball 30 was mounted. In the invention, moreover, the gas injection is performed through the suction port 20 of the holder head 2 either while the flux is being removed from the holding face 21 or before a next conductive ball is held on the holder head 2 after the removal.

The holder head 2 is equipped with: an X-axis moving device 22 (i.e., a moving device in the leftward and rightward directions of FIG. 1); a Y-axis moving device 24 (i.e., a moving device in the upward and downward directions of FIG. 1); and a Z-axis moving device 23 acting as a lifting device of the holder head 2. As a result, the holder head 2 can move in the X-axis direction, in the Y-axis direction, and upward and downward. The movements of the holder head 2 by the X-axis moving device 22, the Y-axis moving device 24 and the Z-axis moving device 23 are the upward movement of the ball feeding unit 3, the upward and downward movements for the ball suction, the upward movement of a Θ-turning stage 41, the upward and downward movements for the action to mount the ball, the movement to the ball inspection unit 7, movement to the solder ball recovery unit 8 and the movement to the flux removing unit 9.

The workpiece supporting unit 4 comprises the Θ-turning stage 41 for positioning and placing the substrate 25, on which the solder ball 30 is mounted, at a predetermined position. The Θ-turning stage 41 can turn in the Θ direction. The substrate 25 is conveyed onto the Θ-turning stage 41 by a workpiece feeding conveyor 13 and a stage conveyor 14 so that it is positioned by the actions of the not-shown stopper and the Θ-turning stage 41. Here, the substrate 25 having mounted the solder ball 30 is discharged by a discharge conveyor 15.

The members, which are positioned in the depths of the ball feeding unit 3 and the solder ball recovery unit 8 across the workpiece supporting unit 4, are the transfer head 5 for transferring the flux to the substrate 25, and the flux feeding unit 6 for feeding the flux to the transfer head 5. Reference numeral 61 designates a squeezee for homogenizing the flux of the flux feeding unit 6. Incidentally, the flux transfer head 5 is also equipped, like the holder head 2, with the X-axis moving device 22, the Z-axis moving device 23 and the Y-axis moving device 24, so that the flux is transferred to the workpiece before the solder ball 30 is mounted.

Numeral 31 designates a ball container acting as the ball feeding unit 3, and the numeral 8 designates the solder ball recovery unit. The ball inspection unit 7 and the flux removing unit 9 are arranged between the solder ball recovery unit 8 and the ball feeding unit 3. Here, the solder ball recovery unit 8, the ball inspection unit 7, the flux removing unit 9 and the ball feeding unit 3 are sequentially arranged in the straight moving route of the holder head 2.

The ball inspection unit 7 is equipped with a light emitting unit 71 and a projected/received light sensor 72. The light emitting unit 71 irradiates the holding face 21 of the holder head 2 with an inspection light so that the light to go into the inside of the holder head 2 from the suction port 20 missing the solder ball 30 may be detected to discover the solder ball 30. By moving the holder head 2 at the level which is passed just above by the normally held solder ball 30 without shielding the inspection light, on the other hand, the projected/received light sensor 72 arranged in the moving route of the holding face 21 inspects the ball at a position lower than the holder head 2 thereby to discover the excess ball. After the ball was mounted, moreover, the projected/received light sensor 72 is also caused to act as residual ball inspecting means by moving the holder head 2 at the level where the solder ball 30 normally held shields the inspection light.

The flux removing unit 9 is constituted to include a cleaning member 10 made of nonwoven fabric or sponge for wiping off the flux adhered to the holding face 21, and a saving device 12 activated by a cylinder 11 for moving between an acting position, at which the cleaning member 10 is brought into abutment to wipe off the holding face 21, and a saved position. The cleaning member 10 is made larger than the width, as taken in a direction to intersect with the relative moving direction of the holder head 2, of the holding face 21. The avoidance of the contact between the holding face 21 and the cleaning member 10 can be caused not only by the saving action of the flux removing unit 9 but also on the side of the holder head 2 by saving the holder head 2 upward.

The actions of the first embodiment are described in the following. First of all, the holder head 2 is positioned at the ball feeding unit 3 so that the solder ball 30 blown in the ball container 31 is sucked onto the holding face 21. When the solder ball 30 is held, the holder head 2 is transversely moved to pass above the ball inspection unit 7 thereby to inspect the missing or excess of the solder ball 30. At this time, the cylinder 11 acts to save the cleaning member 10 so that the holder head 2 may not drop the solder ball 30 held in contact with the cleaning member 10 of the flux removing unit 9.

When the ball inspection unit 7 does not inspect the missing or excess of the solder ball 30, the holder head 2 arrives, as it is, on the substrate 25 of the workpiece supporting unit 4, and mounts the solder ball 30. With the missing or excess, the holder head 2 returns to the ball feeding unit 3, and holds again the solder ball 30 after it released. The missing of the solder ball 30 is discovered by irradiating the holding face 21 of the holder head 2 at the ball inspection unit 7 with the inspection light coming from the light emitting unit 71, and by detecting the light to enter from the suction port 20 missing the solder ball 30. The excess ball is discovered by arranging the projected/received light sensor 72 in the moving route of the holding face 21, by moving the holder head 2 at the level which is passed just above by the normally held ball without shielding the inspection light, and by inspecting the solder ball 30 at a lower position.

After the ball was mounted, the residue of the solder ball 30 is inspected by the projected/received light sensor 72. In this case, the holder head 2 is moved at the level where the solder ball 30 normally held shields the inspection light. As soon as the residue is discovered, the holder head 2 is retracted to the solder ball recovery unit 8 so that the holder head 2 may not arrive above the ball feeding unit 3 while holding the residual ball. Since the flux removing unit 9 is arranged adjacent to the ball inspection unit 7, the holding face 21 of the holder head 2 comes, while passing through the inspection position of the projected/received light sensor 72 of the ball inspection unit 7, into contact with the cleaning member 10 of the flux removing unit 9 sequentially from the inspection-ended portion in a state that the holding face 21 does not hold the residual ball. When the residual ball is then detected, the movement of the holder head 2 to the ball feeding unit 3 is stopped, and the holder head 2 is retracted to the solder ball recovery unit 8. It is, therefore, possible to prevent the solder ball 30 having the flux adhered thereto from falling at the ball feeding unit 3.

After the ball was mounted, the cleaning member 10 is at the acting state, in which the cleaning member 10 is brought, while the holder head 2 is being moved toward the ball feeding unit 3, into contact with the holding face 21 thereby to wipe the flux off the moving holding face 21. At this time, the cleaning member 10 is brought into contact with the holding face 21 after the absence of the residual solder ball 30 was confirmed, so that the residual ball is not pushed into the suction port 20. Not only by the flux wiping action but also by activating the pressure means 27 to inject the compressed air from the suction port 20, moreover, the flux adhered to the edge of the suction port 20 can be blown off, and the adhered flux can be prevented from entering the suction port 20 at the wiping time. Thus, in the moving route of the holder head 2 to move toward the ball feeding unit 3, the cleaning member 10 of the flux removing unit 9 is disposed to abut against the moving holding face 21. Therefore, the flux can be removed in each ball mounting action thereby to keep the holding face 21 always clean, and no additional removing step is required to keep the tact time unincreased.

After the end of the wiping of the flux at the cleaning member 10, the holder head 2 goes toward the ball feeding unit 3. At this time, however, the flux having stuck to the edge of the suction port 20 can also be blown off by activating the pressure means 27 at a position avoiding the ball feeding unit 3 thereby to inject the compressed air from the suction port 20.

Second Embodiment

Figure 3:
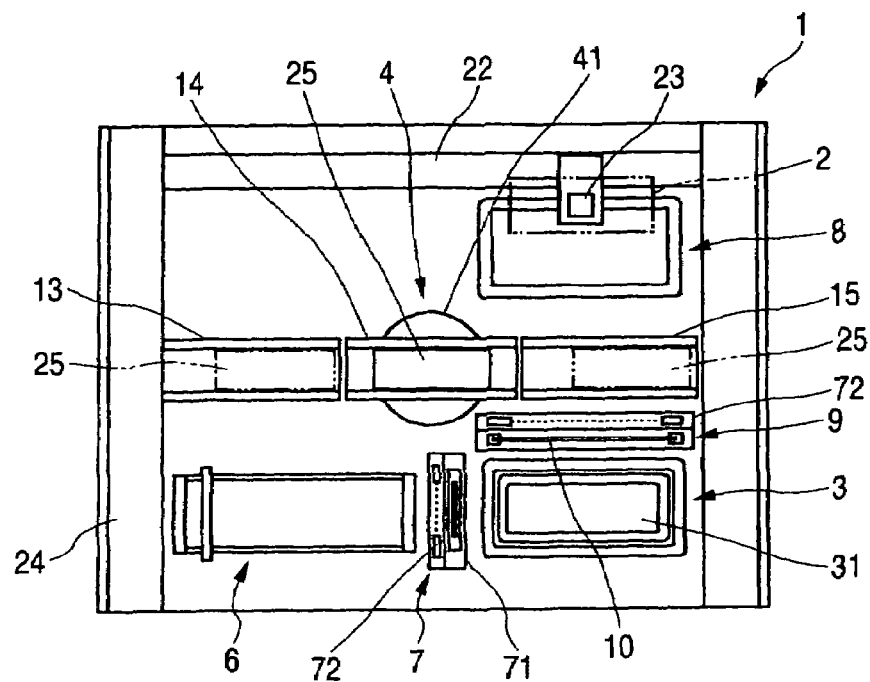
FIG. 3 is a schematically explanatory top plan view showing the entirety of a second embodiment of the solder ball mounting apparatus.
Figure 4:
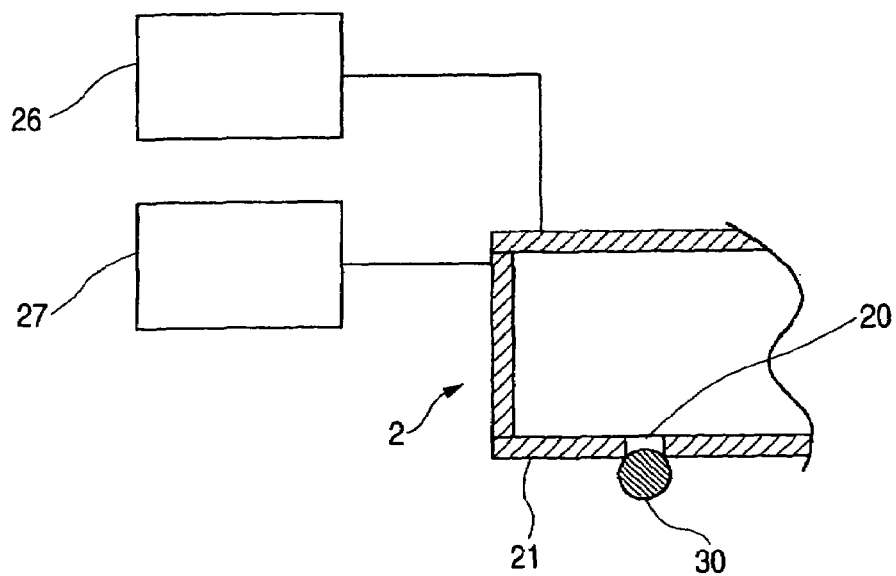
FIG. 4 is an explanatory view showing relations among a holder head, vacuum means and pressure means.

Here, the first embodiment is constituted such that the flux is transferred before the mounting action to the substrate 25 by the transfer head 5. As a second embodiment, however, there can be conceived a constitution, in which the holder head 2 moves, after it held the solder ball 30, to the flux feeding unit 6 to adhere the flux to the solder ball 30 and then to mount the ball on the substrate 25, as shown in FIG. 3. In the case of this constitution, the moving route of the holder head 2 is different from that of the first embodiment. As shown in FIG. 3, therefore, the flux feeding unit 6 is positioned in the X-axis direction (as located on the left side of FIG. 3) of the ball feeding unit 3, and the solder ball recovery unit 8 is positioned in the Y-axis direction (as located on the upper side of FIG. 3) of the ball feeding unit 3.

In either event, the ball inspection unit 7 and the flux removing unit 9 exist midway of the action route of the holder head 2 between the ball feeding unit 3 and the solder ball recovery unit 8, and the flux removing unit 9 is arranged, even in the constitution of the second embodiment between the projected/received light sensor 72 acting as the residual ball inspecting means and the ball feeding unit 3, so that advantages like those of the first embodiment can be attained. By providing the projected/received light sensor 72 separately as excessive ball inspecting means, moreover, the cleaning member 10 can be given a level to abut at all times. In this modification, the saving device 12 can be omitted.

Third Embodiment

As a third embodiment, there can also be conceived a constitution, in which the flux removing unit 9 has a face to abut against the holding face 21 of the holder head 2 so that the flux may be removed by moving the holding face 21 and the abutting face relative to each other while the two faces contacting with each other.

Figure 5:
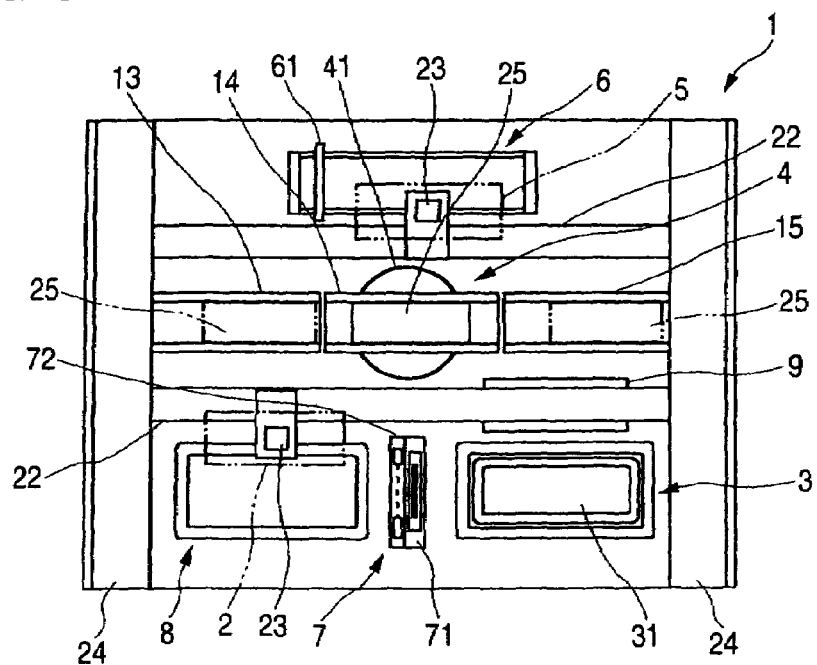
FIG. 5 is a schematically explanatory top plan view showing the entirety of a solder ball mounting apparatus according to a third embodiment.
Figure 6:
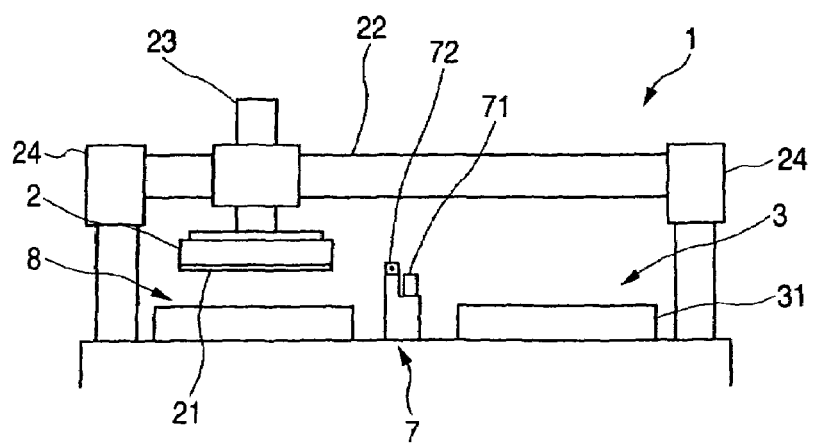
FIG. 6 is an explanatory front elevation of the same.

The third embodiment of the invention is described with reference to the accompanying drawings. Like the first embodiment, the third embodiment uses the solder ball mounting apparatus as the conductive ball mounting apparatus. FIG. 5 is a schematically explanatory top plan view showing the entirety of the solder ball mounting apparatus 1 of the third embodiment, and FIG. 6 is a front elevation of the same. Here, the description of the components common to the first embodiment is omitted by designating them by the same reference numerals.

The holding face 21 of the holder head 2 is finished into a mirror surface so that it can wipe off the adhered flux cleanly with the flux removing unit 9. The holding face 21 is also enabled to achieve similar advantages not only by the mirror surface but also by subjecting it to a water-repellent treatment as a Teflon-treated face. It is natural that the holding face 21 need not be especially formed into the mirror surface or the water-repellent surface.

As shown in FIG. 5, the transfer head 5 and the flux feeding unit 6 are positioned in the depths of the ball feeding unit 3, the solder ball recovery unit 8 and the flux removing unit 9 across the workpiece supporting unit 4.

The ball inspection unit 7 is arranged between the solder ball recovery unit 8 and the ball feeding unit 3. Here, the solder ball recovery unit 8, the ball inspection unit 7 and the ball feeding unit 3 are sequentially arranged in the straight moving route of the holder head 2.

On the flux removing unit 9, there is formed an abutting face 80, which comes into abutment against the holding face 21 of the holder head 2 to wipe off the flux adhered to the holding face 21. The abutting face 80 is equipped on its surface with a flux wiping absorptive sheet 81, which can be easily replaced. The flux wiping absorptive sheet 81 is exemplified by a sheet made of woven fabric, nonwoven fabric, paper or thin sponge suited for absorbing the flux. The abutting face 80 is preferred to have a size substantially equal to that of the holding face 21. The larger abutting face 80 can wipe the sooner, because its reciprocating distance for the wiping action is shortened.

The holder head 2 and the flux removing unit 9 are constituted such that both the holding face 21 and the abutting face 80 are moved in contact relative to each other thereby to remove the flux. Moving means therefor is disposed on either or both the holder head 2 and the flux removing unit 9. The third embodiment uses the X-axis moving device 22 (i.e., the leftward and rightward moving devices in FIG. 5) of the holder head 2. Here, the relative movement is not limited to the reciprocations such as reciprocating transverse movements but may be turning motions, and the number of reciprocating movements or turning motions is properly determined.

The flux wiping absorptive sheet 81 of the abutting face 80 of the flux removing unit 9 slides relative to the holding face 21 so that it needs means for keeping the absorptive sheet in position. In the third embodiment, in order that the absorptive sheet may be kept in position by the slide, a porous material 82 having its rough surface undulations of a high friction resistance is arranged in a staggered shape in the flux removing unit 9 below the flux wiping absorptive sheet 81. Moreover, a suction passage 83 connected to the not-shown suction device is so disposed below the porous material 82 as to contact with the porous material 82. As a result, the absorptive sheet 81 is not brought out of position by the frictional resistance of the surface of the porous material 82 and the attraction from the side of the suction passage 83. Moreover, the holding face 21 of the holder head 2 can be cleared of dust by the suction.

The actions of the third embodiment are described in the following. First of all, the holder head 2 is positioned at the ball feeding unit 3 so that the solder ball blown in the ball container 31 is sucked onto the holding face 21. When the solder ball is held, the holder head 2 is transversely moved to pass above the ball inspection unit 7 thereby to inspect the missing or excess of the solder ball 30.

If the ball inspection unit 7 does not inspect the missing or excess of the solder ball, the holder head 2 arrives, as it is, on the substrate 25 of the workpiece supporting unit 4, and mounts the solder ball. With the missing or excess, the holder head 2 returns to the ball feeding unit 3, and holds again the solder ball after it released. The missing of the solder ball is discovered by irradiating the holding face 21 of the holder head 2 at the ball inspection unit 7 with the inspection light coming from the light emitting unit 71, and by detecting the light to enter from the suction port missing the solder ball. The excess is discovered by arranging the projected/received light sensor 72 in the moving route of the holding face 21, by moving the holder head 2 at the level which is passed just above by the normally held ball without shielding the inspection light, and by inspecting the solder ball 30 at a lower position.

After the ball was mounted, the holder head 2 moves to above the solder ball recovery unit 8 and then transversely passes above the ball inspection unit 7, and the residue of the solder ball is inspected by the projected/received light sensor 72. In this case, the holder head 2 is moved at the level where the solder ball normally held shields the inspection light. As soon as the residue is discovered, the holder head 2 is retracted to the solder ball recovery unit 8 thereby to discard the residual ball.

The holder head 2 having been inspected by passing through the ball inspection unit 7 is moved above the flux removing unit 9 and then downward to bring its holding face 21 into abutment against the abutting face 80 of the flux removing unit 9. Since the flux wiping absorptive sheet 81 resides on the surface of the abutting face 80, it is sopped with the flux adhered to the holding face 21. In addition, the holding face 21 is transversely slid in contact with the flux wiping absorptive sheet 81 by the X-axis moving device 22 of the holder head 2 so that it can wipe off the flux adhered to the holding face 21, without fail. Since the flux removing unit 9 is sucked by the suction device, the dust can be sucked and removed, even if adhered to the holding face 21, to the flux wiping absorptive sheet 81.

At this time, the abutting face 80 of the flux removing unit 9 is caused to contact with the holding face 21, after no solder ball was confirmed to reside. As a result, the residual ball is hardly pushed into the suction port. By activating the pressure means to inject the compressed air from the suction port as well as the flux wiping action, moreover, the flux adhered to the edge of the suction port can be blown off and prevented from entering the suction port at the wiping time. Thus, the flux can be removed at each ball mounting action thereby to keep the holding face 21 clean at all times. Here, the flux is such a transparent liquid as to make it impossible to easily detect whether or not the flux is adhered to the holder head 2, so that the flux removal is performed in each ball mounting action. However, the holder head 2 may be cleared, only when adhered, of the flux, if the existence of the flux adhered can be detected.

After the end of the wiping of the flux at the flux removing unit 9, the holder head 2 goes toward the ball feeding unit 3.

At this time, however, the flux having stuck to the edge of the suction port can also be blown off by activating the pressure means 27 at a position avoiding the ball feeding unit 3 thereby to inject the compressed air from the suction port.

Fourth Embodiment

Figure 7:
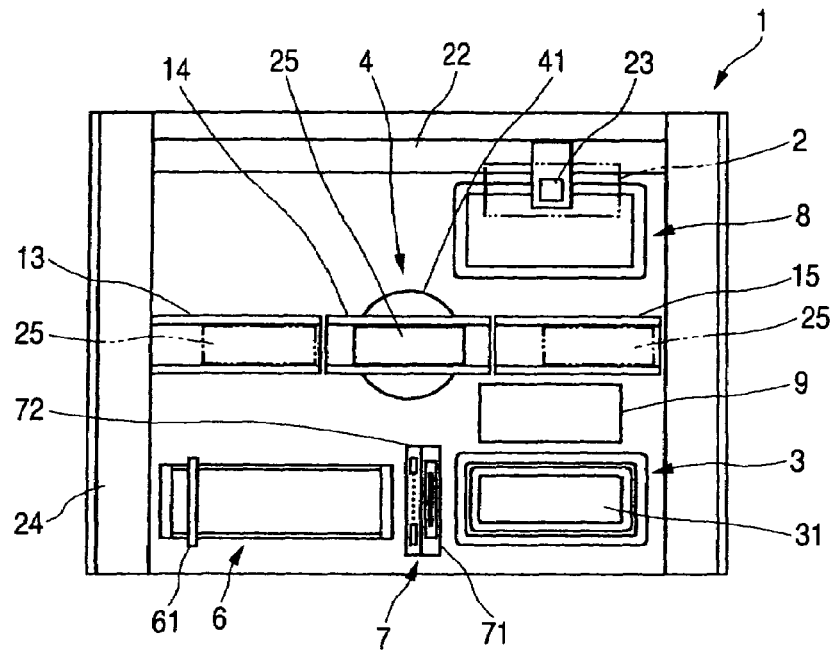
FIG. 7 is a schematically explanatory top plan view showing the entirety of a fourth embodiment of the solder ball mounting apparatus.
Figure 8:
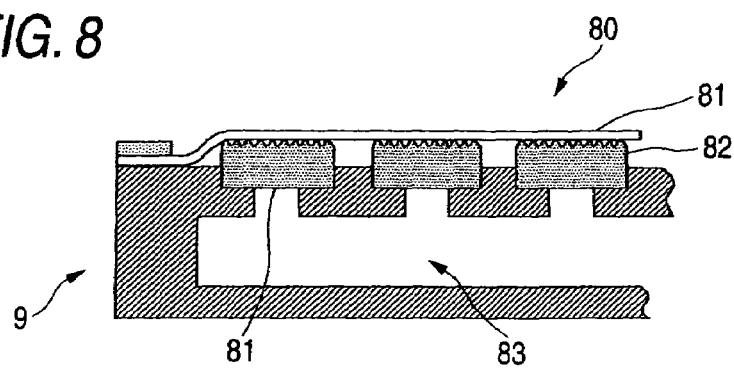
FIG. 8 is a partially sectional explanatory view of a flux removing portion.

Here, the third embodiment is constituted such that the flux is transferred before the mounting action to the substrate 25 by the transfer head 5. As a fourth embodiment, however, there can be conceived a constitution, in which the holder head 2 moves, after it held the solder ball, to the flux feeding unit 6 to adhere the flux to the solder ball and then to mount the ball on the substrate 25, as shown in FIG. 7.

Here, the first to fourth embodiments are constituted such that the holder head 2 moves in the X-axis direction and in the Y-axis direction. By fixing the holder head 2 on the X-axis and on the Y-axis or omitting either the X-axis moving device 22 or the Y-axis axis moving device 24, however, relative moving actions can be conceived to move another component.

What is claimed is:

1. A conductive ball mounting apparatus comprising:
a holder head having a suction port formed in a holding face for sucking a conductive ball;
a ball feeding unit for feeding the conductive ball to the holder head;
a workpiece supporting unit for supporting a workpiece to mount the conductive ball thereon; and
action means for positioning a positioner that positions the holder head at the ball feeding unit and at the workpiece supporting unit, whereby the apparatus mounts the conductive ball on the workpiece with interposing a flux therebetween,
wherein the apparatus further comprises a flux remover that contacts the holding face and removes the flux adhered to the holding face, and
wherein the flux remover is arranged in a relative action route at the time when the holder head is positioned at the ball feeding unit;
wherein the flux remover includes a cleaning member for wiping off the flux and a mover that moves the cleaning member, and
wherein the cleaning member can be moved by the mover to an acting position where the cleaning member contacts with the holding face and to a saved position where the contact is avoided.

2. The conductive ball mounting apparatus according to claim 1,
wherein the apparatus further comprises a residual ball inspector that inspects the presence of the conductive ball on the holding face after the conductive ball is mounted on the workpiece, and
wherein the flux remover is arranged between the residual ball inspector and the ball feeding unit.

3. A conductive ball mounting apparatus comprising:
a holder head having a suction port formed in a holding face for sucking a conductive ball;
a ball feeding unit for feeding the conductive ball to the holder head;
a workpiece supporting unit for supporting a workpiece to mount the conductive ball thereon; and
action means for a positioner that positions the holder head at a predetermined position, whereby the conductive ball is mounted on the workpiece with interposing a flux therebetween, wherein the apparatus further comprises a flux remover that removes the flux adhered to the holding face, and wherein the flux remover has an abutting face, against which the holding face of the holder head comes into abutment, so that the holding face and the abutting face may be moved relative to each other while contacting with each other.

4. The conductive ball mounting apparatus according to claim 3, wherein the relative movements of the abutting face and the holding face are transverse reciprocations.

5. The conductive ball mounting apparatus according to claim 3, further comprising an absorptive sheet for absorbing the flux on the abutting face thereby to wipe off the flux.

6. The conductive ball mounting apparatus according to claim 5, further comprising a shift preventer disposed on the abutting face for preventing the absorptive sheet from coming out of position.

7. The conductive ball mounting apparatus according to claim 5, further comprising a shift preventer provided between the abutting face and the absorptive sheet for preventing the absorptive sheet from coming out of position.

8. The conductive ball mounting apparatus according to claim 3, wherein the holding face is formed into a mirror surface or a water-repellent surface.

9. The conductive ball mounting apparatus according to claim 3, further comprising an injector that injects compressed air into an internal space of the holder head.

10. The conductive ball mounting apparatus according to claim 1, further comprising an injector that injects compressed air into an internal space of the holder head.

* * * * *